(12) United States Patent
Ross

(10) Patent No.: US 6,380,804 B1
(45) Date of Patent: Apr. 30, 2002

(54) METHOD AND APPARATUS FOR SWITCHING STAGES OF A MULTISTAGE AMPLIFIER QUICKLY BETWEEN OPERATIONAL MODES

(75) Inventor: Robert Ross, Raleigh, NC (US)

(73) Assignee: Mitsubishi Electric & Electronics U.S.A., Cypress, CA (US)

( * ) Notice: Subject to any disclaimer, the term of this patent is extended or adjusted under 35 U.S.C. 154(b) by 0 days.

(21) Appl. No.: 09/589,187

(22) Filed: Jun. 8, 2000

(51) Int. Cl.[7] .............................. H03F 1/14; H03F 3/18; H03G 3/10; H03G 5/16
(52) U.S. Cl. .................... 330/51; 330/150; 330/280; 330/133; 330/134
(58) Field of Search ..................... 330/51, 129, 150, 330/280, 310, 133, 134

(56) References Cited

U.S. PATENT DOCUMENTS

| | | | |
|---|---|---|---|
| 4,158,819 A | * | 6/1979 | Smither .......................... 330/9 |
| 5,166,638 A | | 11/1992 | Koga .......................... 330/261 |
| 5,446,601 A | | 8/1995 | Fukuta .......................... 360/46 |
| 5,548,453 A | * | 8/1996 | Sasaki et al. ................ 330/259 |
| 5,608,350 A | | 3/1997 | Ebukuro | |
| 6,175,278 B1 | * | 1/2001 | Hasegawa ................... 330/278 |

FOREIGN PATENT DOCUMENTS

| | | |
|---|---|---|
| EP | 0 600 515 | 6/1994 |
| EP | 0 836 273 | 4/1998 |

* cited by examiner

Primary Examiner—Robert Pascal
Assistant Examiner—Patricia Nguyen
(74) Attorney, Agent, or Firm—Burns, Doane, Swecker & Mathis, LLP

(57) ABSTRACT

The stages of a multistage amplifier are quickly switched between operational modes, e.g., from a standby mode to an active mode. The delivery of a control signal to each individual stage is delayed so that the modes of the stages are switched, in a desired sequence. The final amplifier stage is isolated from the operational mode switching of the preceding stages by a buffer. For switching the multistage amplifier from the standby mode to the active mode, the stages and the buffer are turned on, in a desired sequence, beginning with the first stage. For switching the multistage amplifier from the active mode to the standby mode, the stages and the buffer are turned off, in a desired sequence, beginning with the buffer. A delay unit includes a plurality of delay units, one connected to each amplifier stage, except the final amplifier stage, and to the buffer.

18 Claims, 6 Drawing Sheets

METHOD AND APPARATUS FOR SWITCHING STAGES OF A MULTISTAGE AMPLIFIER QUICKLY BETWEEN OPERATIONAL MODES

BACKGROUND

This invention relates generally to a method and apparatus for switching stages in a multistage amplifier. More specifically, this invention relates to a method and apparatus for switching stages of a multistage amplifier quickly between operational modes.

In multistage amplifier designs, e.g., multistage bipolar amplifier designs, it is difficult to switch between modes such as normal and standby (low power) modes quickly without generating excessive output transient voltages. Depending on the sequence in which the stages are turned ON or OFF, excessive recovery time can result from the saturation of one or more stages during the transition time. Also, any output voltage shifts or transients can have undesirable effects on circuitry connected to the output of the amplifier. If all of the stages are turned OFF during the standby mode, the amplifier output will not remain in its normal low impedance state. Thus, the output of the final stage may take a while to settle, which may have an adverse effect on circuitry following the final amplifier stage, e.g., when the output is AC-coupled to the following circuitry. Alternately, if the output stage remains ON while the preceding stages are turned OFF, the output stage will generally be saturated when its input (the output of the preceding stage) is pulled up towards the positive supply. In addition, this design suffers from excessive turn-on recovery time. Neither of these designs is acceptable in many of today's designs for applications such as high-end preamplifiers.

U.S. Pat. No. 5,446,601 describes a circuit in which recovery time in a read-write amplifier is minimized by switching the output into a high impedance state for a predetermined time in order to inhibit any switching transient from reaching the output. This option is not acceptable in cases where it is required that the output maintain a low impedance. Also, this option may not be effective for cases requiring recovery times much faster than a few hundred nanoseconds.

U.S. Pat. No. 5,166,638 discloses an amplifier having an output stage that is quickly made inactive by a control signal. This patent specifically addresses only the transition time from an active mode to an inactive mode for a differential-in, single-ended-out amplifier stage.

None of the prior art addresses the problem of quickly switching multiple amplifier stages between operational modes, e.g., from a standby mode to an active mode. This problem must be addressed in order to meet the mode-switching requirements of today's designs for applications such as high-end preamplifier.

There is thus a need for a technique for switching multiple amplifier stages quickly between operational modes, without generating output transient voltages.

SUMMARY

It is therefore an object of the present invention to provide a technique for quickly switching multiple amplifier stages between operational modes, e.g., from a standby mode to an active mode, while avoiding output transients.

According to an exemplary embodiment, this and other objects are met by a method and apparatus for switching multiple amplifier stages between operational modes. The delivery of a control signal to each individual stage is delayed by a delay unit so that the modes of the stages are switched in a desired sequence. The final amplifier stage is isolated from the operational mode switching of the preceding stages by a buffer. For switching the multistage amplifier from the standby mode to the active mode, the buffer and stages preceding the final stage are turned on, in a desired sequence, beginning with the first stage and ending with the buffer. For switching the multistage amplifier from the active mode to the standby mode, the buffer and the stages preceding the final stage are turned off, in a desired sequence, beginning with the buffer and ending with the first stage. The delay unit includes a plurality of delay units, one connected to each amplifier stage except the final amplifier stage. A delay unit is also connected to the buffer isolating the final amplifier stage.

BRIEF DESCRIPTION OF THE DRAWINGS

The features, objects, and advantages of the invention will become apparent by reading this description in conjunction with the accompanying drawings, in which like reference numerals refer to like elements and in which.

DETAILED DESCRIPTION

According to an exemplary embodiment, a device is provide for switching stages in a multistage amplifier between operational modes. While the description below is directed to switching between stand-by and active modes, it will be appreciated that the invention may be applicable to switching for other types of operational modes.

Figure 1:
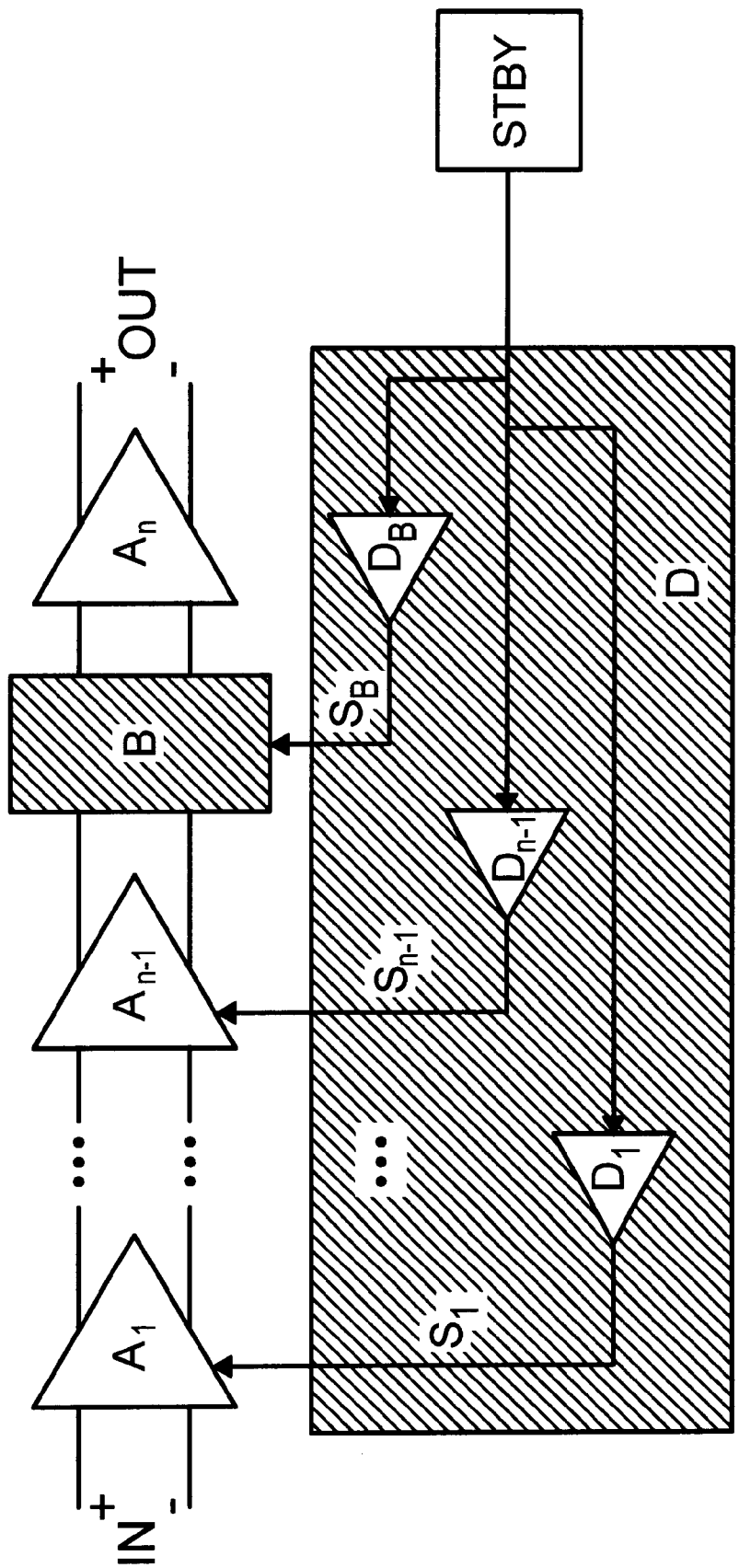
FIG. 1 illustrates an exemplary device for switching stages of a multistage amplifier.

An exemplary device is shown in FIG. 1. The amplifier includes multiple cascaded amplifier stages $A_1, \ldots A_{n-1}, A_n$ for amplifying an input voltage and producing an output voltage. Although three stages are shown in FIG. 1, it will be appreciated that any number of stages may be used.

The device for switching the amplifier stages between a standby mode and an active mode includes an interstage buffer B preceding the final stage $A_n$ and a switching delay circuit D driven by a mode control signal STBY. According to an exemplary embodiment, the switching delay circuit D selectively delays the rising and/or falling edges of the STBY signal and transmits separate delayed versions of the STBY signal to the various amplifier stages preceding the final stage and the buffer B to change the operational modes of the stages and the buffer. The delay circuit D may be included in the amplifier or implemented in a separate device, the delay circuit D includes a plurality of delay units $D_1, \ldots D_{n-1}$ connected to the individual amplifier stages $A_1, \ldots, A_{n-1}$, respectively, and a delay unit $D_B$ connected to the buffer B.

The buffer B and delay units $D_1, \ldots D_{n-1}$, and $D_B$ allow maximum power savings during the standby mode with minimal impact on turn-on delay time, or normal mode power dissipation. The delay units are also used to optimize the turn-on sequence for the various stages. It is particularly important that the bias current turn-on of each stage not occur until after the voltage output of the preceding stage has settled to an acceptable value. Any stage which is biased-up too soon may become saturated.

The buffer B isolates the final stage A. from the preceding stage $A_{n-1}$ during a standby mode, in which STBY is high, to ensure that the final stage $A_n$ does not saturate. This maintains the final stage input voltage within normal limits in order to allow the final stage to remain ON while the other stages are turned OFF, thus allowing the voltage output of the amplifier to remain in its normal low impedance state, while still providing greatly reduced power dissipation.

The buffer B receives a modified STBY signal having a delayed falling edge (standby-to-active transition). The amplifier stages preceding the buffer B receive a modified STBY signal having a delayed rising edge (active-to-standby transition). This insures that the buffer stage B is switched in before the preceding stage is turned off and keeps the final stage isolated until after the preceding stage has returned to the active mode. If multiple stages precede the buffer B, this circuit will also successively increase the rising edge delay of STBY for the earlier stages while successively increasing the falling edge delay of STBY for the later stages and buffer.

Although not shown, another buffer may be included at the output of the final stage An so that the bias current of the output stage can be reduced without affecting the output voltage.

Figure 2:
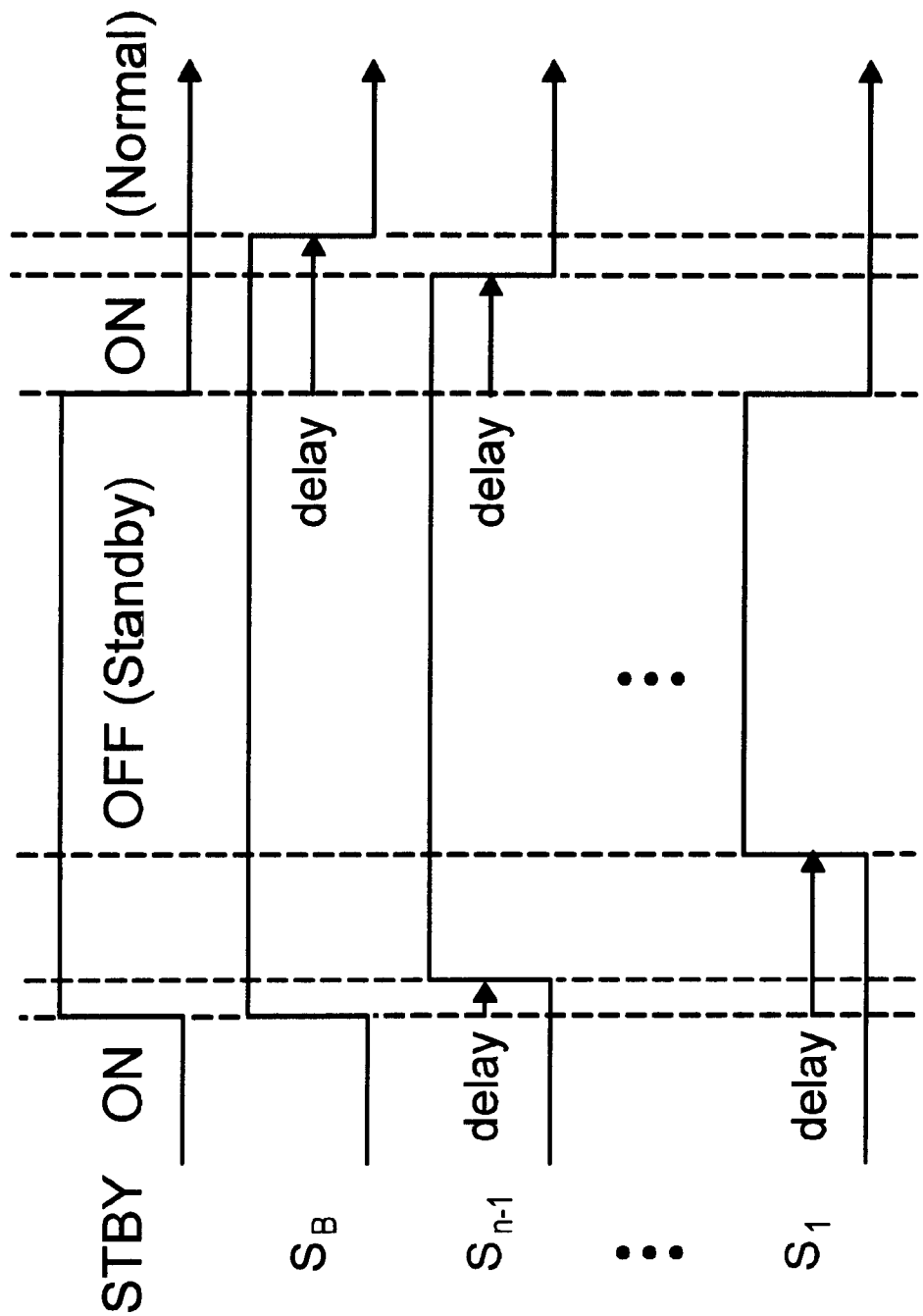
FIG. 2 illustrates a timing diagram showing the timing of delivery of mode switching signal to the amplifier stages and the buffer stages.

FIG. 2 illustrates an exemplary timing diagram for delaying control signals input into the various amplifier stages $A_1, \ldots, A_{n-1}$ and the buffer B. Initially, when the STBY is low, indicating that the amplifier is ON, the signals $S_1, \ldots, S_{n-1}$ and $S_B$ are low. When the STBY signal goes high, indicating that the amplifier is to be turned OFF, the signal $S_B$ goes high at the same time. After a first delay, the signal $S_{n-1}$ goes high, after a second delay, the signal $S_{n-2}$ goes high, etc., . . . until after an n−1 delay, the signal $S_1$ goes high. When the STBY signal goes low again, indicating that the amplifier is to be turned ON, the signal $S_1$ goes low at the same time. After a first delay, the signal $S_2$ goes low, . . . until after a n−2 delay, the signal $S_{n-1}$ goes low. After an n−1 delay, the signal $S_B$ goes low.

Figure 3:
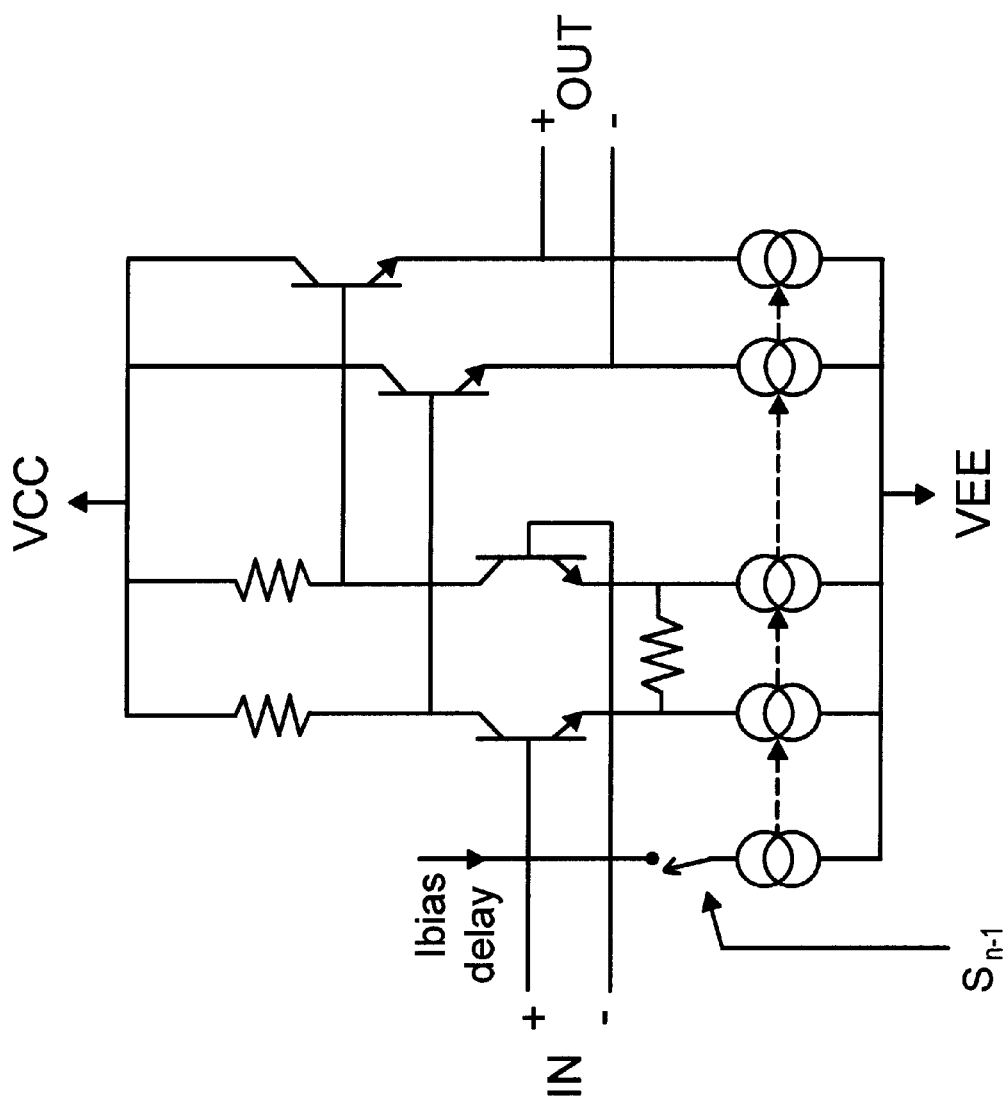
FIG. 3 illustrates details of an exemplary amplifier stage.

FIG. 3 illustrates details of an exemplary amplifier stage. The bias current Ibias to the amplifier stage is enabled when a switch is activated by a low delay signal $S_{n-1}$, indicating that the stage should be turned on.

Figure 4:
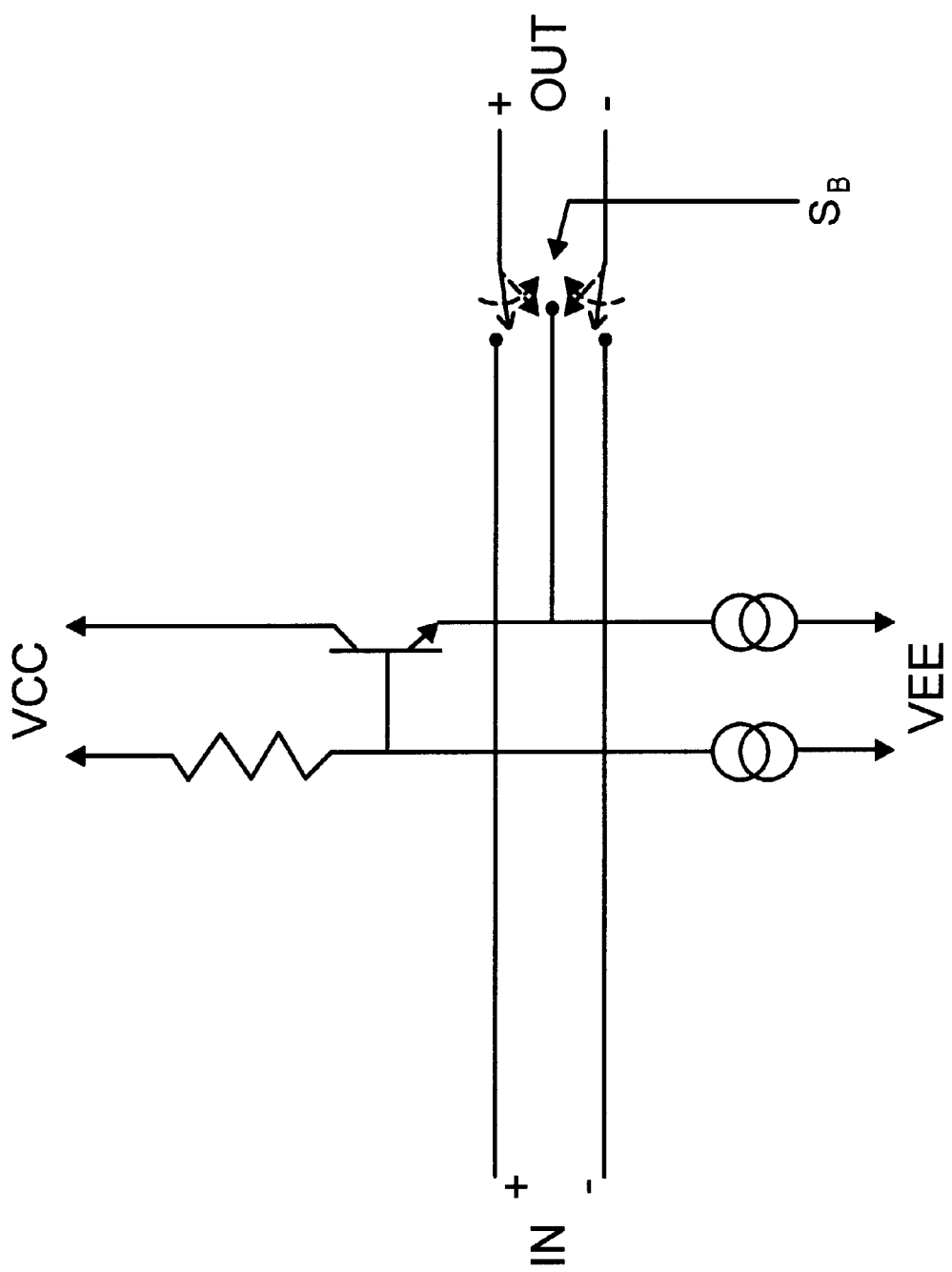
FIG. 4 illustrates details of an exemplary buffer.

FIG. 4 illustrates details of an exemplary buffer. The buffer includes a switch actuated by a buffer delay signal $S_B$. When the signal $S_B$ is high, indicating a standby mode, the buffer is connected to the output by the switch as indicated by the dashed lines, thus isolating the final amplifier stage. When the signal $S_B$ is low, indicating an active mode, the voltage input to the buffer is output to the final amplifier stage.

Figure 5:
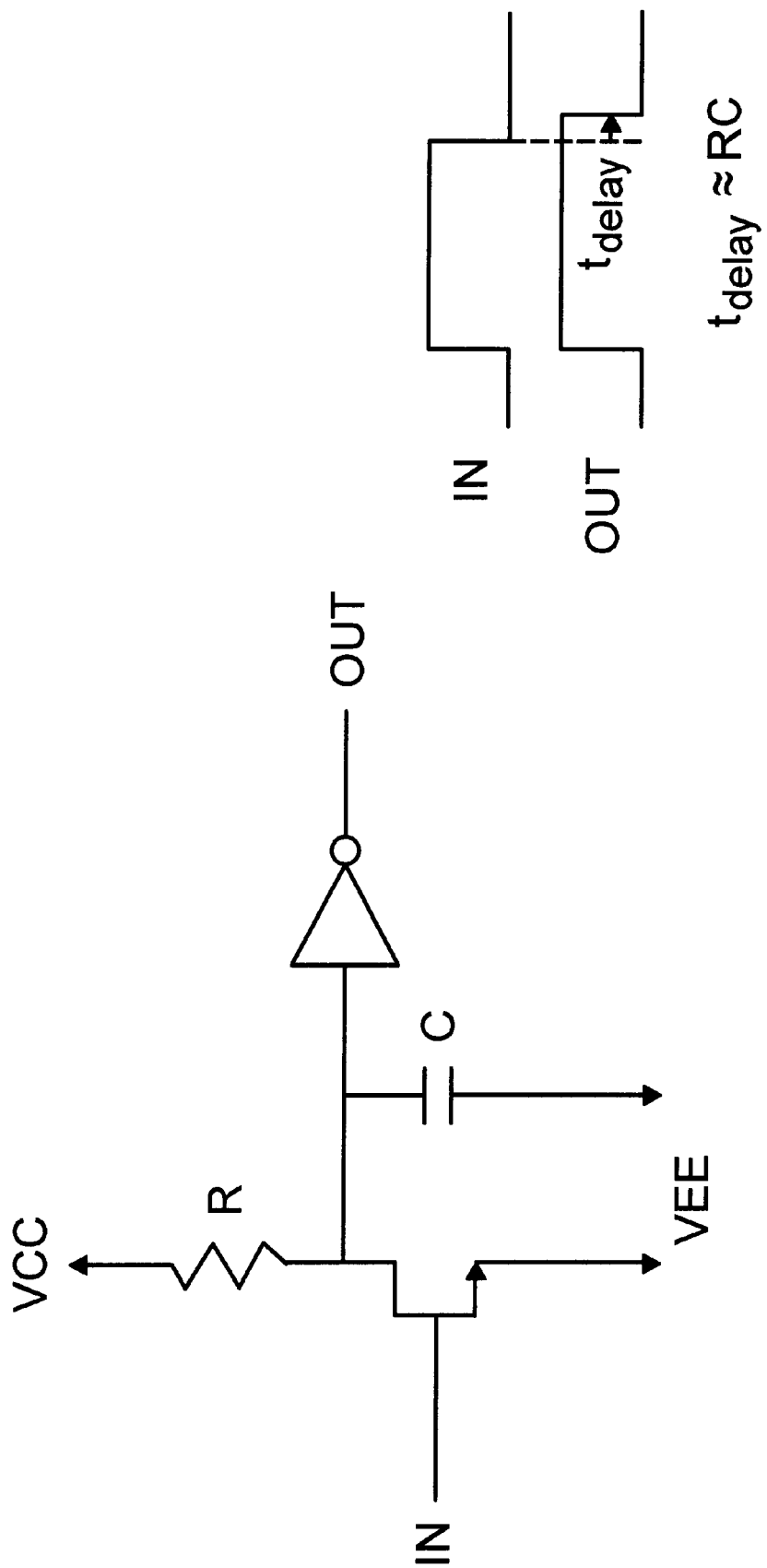
FIG. 5A illustrates details of an exemplary delay unit.
FIG. 5B illustrates an exemplary timing diagram for an individual delay unit.

FIG. 5A illustrates details of an exemplary delay unit. The amount of delay is determined by RC. FIG. 5B illustrates an exemplary timing diagram for a delay signal. The difference between the input to the delay unit and the output of the delay unit is given as $t_{delay}$, where $t_{delay} \approx RC$.

Figure 6:
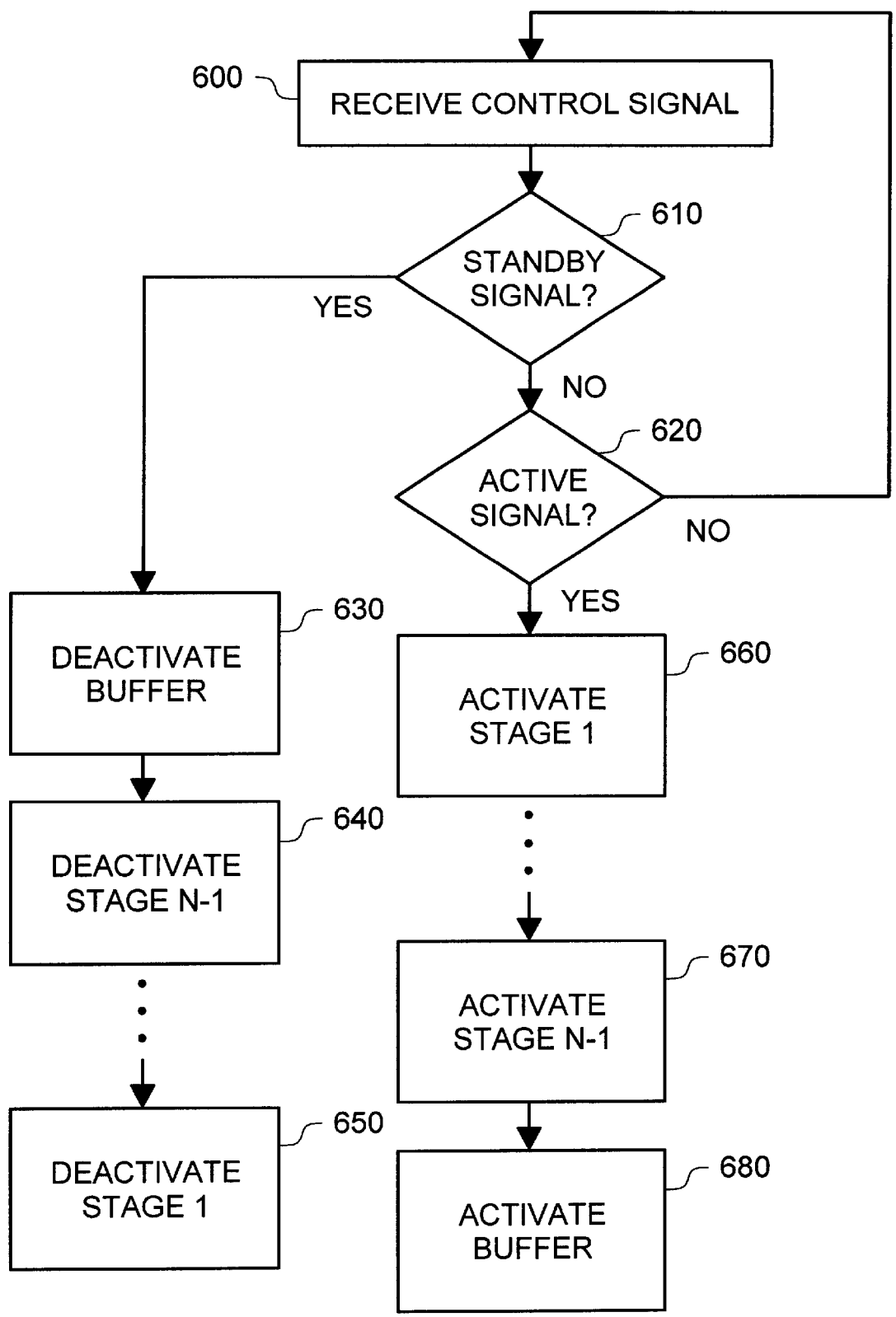
FIG. 6 illustrates a method for switching stages between operational modes.

FIG. 6 illustrates an exemplary method for switching stages of a multistage amplifier. The method begins at step 600 at which a control signal for switching a mode is received by the switching delay circuit D. At step 610, a determination is made whether the control signal indicates a standby mode. If not, a determination is made whether the control signal indicates an active mode at step 620. If not, the process returns to step 600. It will be appreciated that the order of steps 610 and 620 may be reversed.

If, at step 610, the control signal is determined to indicate a standby signal, e.g., the signal is high, the control signal is forwarded to the buffer B to deactivate the buffer at step 630. At step 640, the control signal is delivered to the stage immediately preceeding the buffer to activate that stage. This is repeated for the stages n−1 up until the first stage, which is deactivated at step 650.

If, at step 620, the control signal is determined to indicate an active mode, e.g., the signal is low, the signal is forwarded to the first stage to activate this stage at step 660. Then, the control signal is forwarded to the second stage, third stage, etc., up until the stage n−1 stage is activated at step 670. At step 680, the control signal is forwarded to the buffer to activate the buffer.

In the description above, the buffer and stages of the amplifier are individually switched between operational modes, in a desired sequence. It will be appreciated that the buffer and the stage may also be switched in groups, in a desired sequence.

The multistage amplifier described above may be implemented in a high end preamplifier, e.g., a read amplifier. In such an implementation, the standby mode would occur during a write operation, and the active mode would occur during a read operation. It will be appreciated that this implementation is only one example of many applications in which the invention may be implemented.

According to exemplary embodiments, a method and apparatus are provided for changing the operational modes of a multistage amplifier quickly, while avoiding output transients. Although described with reference to switching a multistage amplifier between standby and active modes, it will be appreciated by those of ordinary skill in the art that this invention can be embodied in other specific forms without departing from its essential character. The embodiments described above should therefore be considered in all respects to be illustrative and not restrictive.

I claim:

1. An apparatus for switching stages of a multistage amplifier between operational modes, comprising:

means for receiving a control signal indicating a mode change;

means for determining the mode change indicated by the received control signal;

means for delaying delivery of the control signal to individual stages of the multistage amplifier to switch the mode of the stages, in a desired sequence, depending on the determined mode; and a buffer preceding a final stage in the multistage amplifier, wherein the buffer isolates the final stage from the operational mode switching of preceding stages in the multistage amplifier.

2. The apparatus of claim 1, wherein for switching the multistage amplifier from an active mode to a standby mode, the delay means delays delivery of the control signal such that the stages and the buffer are turned off, in a desired sequence, beginning with the buffer.

3. The apparatus of claim 1, wherein for switching the multistage amplifier from a standby mode to an active mode, the delay means delays delivery of the control signal such that the stages are turned on, in a desired sequence, beginning with a first stage.

4. The apparatus of claim 1, wherein the means for delaying includes multiple delay units.

5. The apparatus of claim 4, wherein a delay unit is connected to each amplifier stage, except the final amplifier stage, and to the buffer.

6. The apparatus of claim 1, further comprising a buffer following a final amplifier stage.

7. A method for switching stages in a multistage amplifier between operational modes, comprising the steps of:

receiving a control signal indicating a mode change;

determining the mode change indicated by the received control signal;

delaying delivery of the control signal to individual stages of the multistage amplifier to switch the mode of the stages, in a desired sequence, depending on the determined mode; and isolating a final amplifier stage in the multistage amplifier from operational mode switching of preceding stages in the multistage amplifier using a buffer.

8. The method of claim 7, wherein for switching the multistage amplifier from an active mode to a standby mode, the delivery of the control signal is delayed such that the stages and the buffer are turned off, in a desired sequence, beginning with the buffer.

9. The method of claim 7, wherein for switching the multistage amplifier from a standby mode to an active mode, delivery of the control signal is delayed such that the stages and the buffer are turned on, in a desired sequence, beginning with the first stage.

10. The method of claim 7, wherein a plurality of delay units are used for delaying delivery of the control signal to individual stages of the multistage amplifier.

11. The method of claim 10, wherein a delay unit is connected to each amplifier stage, except the final amplifier stage, and to the buffer.

12. The method of claim 7, wherein a buffer is included following the final amplifier stage.

13. An amplifier comprising:

a plurality of stages;

delay circuitry connected to the stages; and a buffer for isolating a final amplifier stage from the operational mode switching of preceding stages in the multistage amplifier, wherein the delay circuitry delays delivery of a control signal to the stages to switch the modes of the stages, in a desired sequence.

14. The amplifier of claim 13, wherein for switching the multistage amplifier from an active mode to a standby mode, the delay circuitry delays delivery of the control signal such that the stages and the buffer are turned off, in a desired sequence, beginning with the buffer.

15. The amplifier of claim 13, wherein for switching the multistage amplifier from a standby mode to an active mode, the delay circuitry delays delivery of the control signal such that the stages and the buffer are turned on, in a desired sequence, beginning with the first stage.

16. The amplifier of claim 13, wherein the delay circuitry comprises a plurality of delay units.

17. The amplifier of claim 16, wherein a delay unit is connected to each amplifier stage, except the final amplifier stage, and to the buffer.

18. The amplifier of claim 13, further comprising a buffer following a final amplifier stage.

* * * * *